(12) United States Patent
Sikora

(10) Patent No.: US 10,473,406 B2
(45) Date of Patent: Nov. 12, 2019

(54) EFFICIENCY OF POWER PLANTS

(71) Applicant: EGPT LIMITED, Dublin (IE)

(72) Inventor: Paul Sikora, Rosscarbery (IE)

(73) Assignee: EGPT LIMITED, Dublin (IE)

( * ) Notice: Subject to any disclaimer, the term of this patent is extended or adjusted under 35 U.S.C. 154(b) by 136 days.

(21) Appl. No.: 15/549,260

(22) PCT Filed: Feb. 3, 2016

(86) PCT No.: PCT/EP2016/052284
§ 371 (c)(1),
(2) Date: Aug. 7, 2017

(87) PCT Pub. No.: WO2016/128278
PCT Pub. Date: Aug. 18, 2016

(65) Prior Publication Data
US 2018/0073817 A1    Mar. 15, 2018

(30) Foreign Application Priority Data
Feb. 9, 2015   (EP) ..................................... 15154291

(51) Int. Cl.
*F28D 20/02* (2006.01)
*F24S 60/30* (2018.01)
(Continued)

(52) U.S. Cl.
CPC ........... *F28D 20/028* (2013.01); *F03G 6/001* (2013.01); *F24S 60/30* (2018.05); *F28D 17/04* (2013.01);
(Continued)

(58) Field of Classification Search
CPC ...... F28D 17/04; F28D 20/0043; F03G 6/001; F24J 2/345; F28F 27/00
See application file for complete search history.

(56) References Cited

U.S. PATENT DOCUMENTS 4,148,436 A  *  4/1979  Shaw ...................... F25B 1/047
                                                                 237/2 B
4,232,523 A     11/1980  Derby
(Continued)

FOREIGN PATENT DOCUMENTS

CN      101825073      9/2010
CN      202581929      12/2012
(Continued)

OTHER PUBLICATIONS

CN-203383905-U English Translation (Year: 2014).*
International Search Report of counterpart Application No. PCT/EP2016/052284 dated Jun. 13, 2016.

*Primary Examiner* — Mark A Laurenzi
*Assistant Examiner* — Shafiq Mian
(74) *Attorney, Agent, or Firm* — Summa PLLC

(57) ABSTRACT

A power plant (1) has an energy converter (3) for converting heat energy to another form of energy with use of a working fluid, and a heat exchanger (4) for rejecting heat from working fluid. A secondary circuit (6) provides coolant to the heat exchanger (4). The secondary circuit (6) includes a heat store (7) arranged to store coolant, a secondary heat exchanger (8), a coolant diverter (12), and a controller configured to route coolant from the working fluid heat exchanger (4) to the heat store (7) in order to reject heat to the store, or to the secondary heat exchanger (8). It chooses between these according to which provides more effective heat rejection from the coolant, and possible other factors. Typically, the controller uses the heat store during daytime and the secondary heat exchanger during night time. This means that heat working fluid is rejecting heat during day time at a temperature of the night time, thereby achieving improved plant efficiency.

27 Claims, 6 Drawing Sheets

(51) Int. Cl.

| | | |
|---|---|---|
| *H02S 10/10* | (2014.01) | |
| *H02S 40/44* | (2014.01) | |
| *F03G 6/00* | (2006.01) | |
| *F28D 17/04* | (2006.01) | |
| *F28D 20/00* | (2006.01) | |
| *F28F 27/00* | (2006.01) | |
| *H01L 35/30* | (2006.01) | |

(52) U.S. Cl.
CPC ......... *F28D 20/0043* (2013.01); *F28D 20/02* (2013.01); *F28F 27/00* (2013.01); *H01L 35/30* (2013.01); *H02S 10/10* (2014.12); *H02S 40/44* (2014.12); *F28D 2020/0069* (2013.01)

(56) References Cited

U.S. PATENT DOCUMENTS

| | | | |
|---|---|---|---|
| 4,249,386 A | 2/1981 | Smith | |
| 4,996,846 A * | 3/1991 | Bronicki | F03G 7/04 60/641.2 |
| 5,321,946 A * | 6/1994 | Abdelmalek | B01D 53/002 165/913 |
| 6,672,064 B2 * | 1/2004 | Lawheed | F01C 1/123 60/641.11 |
| 8,028,535 B2 * | 10/2011 | Sikora | F02C 1/02 165/104.11 |
| 9,014,791 B2 * | 4/2015 | Held | F02C 7/12 600/476 |
| 9,145,795 B2 * | 9/2015 | Lehar | F01K 23/10 60/641.11 |
| 9,441,504 B2 * | 9/2016 | Held | F01K 23/10 60/641.11 |
| 9,593,597 B2 * | 3/2017 | Lehar | F01K 7/02 60/641.11 |
| 9,702,270 B2 * | 7/2017 | Clements | F01K 7/22 60/641.11 |
| 9,751,959 B2 * | 9/2017 | Masi | C08F 10/02 60/641.11 |
| 2003/0000213 A1 * | 1/2003 | Christensen | F01K 25/08 60/670 |
| 2009/0241546 A1 * | 10/2009 | Hegazy | F01K 9/003 60/670 |
| 2010/0018207 A1 * | 1/2010 | Juchymenko | F01K 23/065 60/670 |
| 2010/0275610 A1 * | 11/2010 | Oguchi | F01K 13/02 60/773 |
| 2011/0277469 A1 | 11/2011 | Brenmiller | |

FOREIGN PATENT DOCUMENTS

| | | |
|---|---|---|
| CN | 203383905 U * | 1/2014 |
| FR | 2970069 | 7/2012 |
| WO | 8100596 | 3/1981 |
| WO | 2006100047 | 9/2006 |
| WO | 2011044358 | 4/2011 |
| WO | 2012000002 | 1/2012 |
| WO | 2015186100 | 12/2015 |
| WO | 2015186107 | 12/2015 |

* cited by examiner

EFFICIENCY OF POWER PLANTS

FIELD OF THE INVENTION

The invention relates to power plants for which there is removal of heat from a working fluid.

PRIOR ART DISCUSSION

Fundamental laws of physics limit the efficiency of any type of energy conversion to unity, or 100%. The efficiency of conversion of heat to motive energy using thermodynamic conversion is subject to an additional limitation normally called the Carnot Factor. This factor defines an ultimate efficiency limit of $(1-T_2/T_1)$ on any closed cycle heat engine cycle which takes in heat at an absolute temperature $T_1$ and rejects heat at an absolute temperature $T_2$.

In practice, the efficiency of thermal power production plants is limited by a combination of technical and economic factors. Increasing the intake temperature, $T_1$, is one approach. However, maximum intake temperatures are limited by particulars of the fuel used, by the thermal and mechanical properties of engine component materials, and by the material and fabrication costs: Intake temperatures as high as 1500° C. are achieved in gas turbine power generation, whereas intake temperatures as low as 100° C. can be found in geothermal or waste heat power installations. Each power generation technology faces a different set of challenges in maximising efficiency through maximising the engine intake temperature.

The scope for improving plant performance by means of reducing the exhaust temperature, $T_2$, is more limited since the lower limit for the exhaust temperature for bottoming cycles is the temperature of the available heat sink, typically the nearby air, water or earth.

The rejection of heat from most thermal power plants is carried out with broadly similar equipment and techniques. The generally preferred method is to reject the heat to a body or a flow of water, i.e. to a nearby river, lake or ocean. This method is usually the most economic option wherever it is possible to implement it.

Another possible option is shallow geothermal heat rejection. Ground temperatures typically stabilise at a value close to the yearly average temperature of the site at depths greater than 10-15 metres below the surface. An array of boreholes can be used to establish thermal contact with the thermal capacity of the geological structure beneath the site and thereby to exchange heat with it. This technique is routinely used to provide seasonal energy storage for buildings. Heat is rejected into the ground from buildings during summertime and reclaimed from the ground in winter to stabilise seasonal building temperatures.

Unlike geothermal seasonal heat storage, the requirement in power generation applications is for year round thermal energy dissipation. Hence, unless there are exceptional geological circumstances such as a large subterranean water body, geothermal heat rejection is unlikely to provide a practical method for rejecting heat from a power station.

Rejection of heat from solar thermal power generation to shallow underground and to aboveground assemblies has been considered in patent documents CN2012279471U and WO2011044358 respectively. WO2006/100047 describes latent heat storage with a phase change material. U.S. Pat. No. 4,249,386 describes radiative heat rejection into the night sky with titanium dioxide panels.

If there is no suitable source of water available to the plant for cooling purposes, the preferred option is usually to reject heat to the air. Numerous power generating plants of many types, and particularly solar power generating plants are located in hot, dry locations. High air temperatures are known to have a measurable negative impact on the performance of air-cooled thermal energy conversion plants. This impact has been alleviated traditionally by using wet cooling techniques, for example, by injecting water mist into the air being drawn into the cooling unit.

While this technique is effective in reducing the heat rejection temperature, the method consumes large quantities of water, often a scarce resource in desert locations. For this reason wet cooling in desert-located thermal power plants is increasingly regarded as undesirable from an environmental point of view. In a number of locations its use is restricted or simply not permitted.

Dry air cooling is often used for rejection of heat from power plants located in dry hot regions. The lowest heat rejection temperature attainable in practice with dry air cooling is some degrees above the prevailing air temperature at the site. Heat rejection temperatures may range from 20K down to perhaps 5K above the prevailing ambient air temperature. Air cooling equipment is generally larger and more expensive both to install and to operate than water cooling equipment. This problem is particularly acute in the case of power plants which make use of the steam cycle, either on its own or as the bottoming cycle of a combined cycle arrangement. The extremely low density of steam condensing in ambient temperatures (1 kg of steam will occupy some 12 cubic metres at 50° C. and more than 30 cubic metres at 30° C.) together with the very low operating pressures demand large heat exchangers built to operate in near-vacuum conditions, air purging equipment, and on-going water treatment to maintain adequate plant performance. The result is a heat rejection system which is expensive both to construct and to operate.

High ambient temperatures give rise to another negative impact on the performance of air-cooled fossil-fuelled power plants. This is a progressive reduction in plant output which becomes more pronounced as the ambient temperature rises. The main cause of the output reduction is the decrease in the density of air with increasing temperature. This in turn decreases the combustion turbine output due to the reduced intake air mass flow rate. In areas where peak power demand is closely linked to peak ambient temperatures, this reduction can be sizeable enough to require specific countermeasures. Direct countermeasures involve cooling of the combustion turbine inlet air, thereby increasing its density. Both evaporative cooling and mechanical cooling methods have been devised to avoid the reduction of plant output which would otherwise occur during times of high ambient temperatures.

Evaporative pre-cooling requires a substantial supply of high purity water treated to avoid problems with dissolved solids. Mechanical cooling avoids water consumption, but requires a considerable input of mechanical energy for refrigeration. This parasitic energy consumption inevitably has a negative influence on the overall efficiency of the plant.

The invention is directed towards providing a motive power plant with improved efficiency.

SUMMARY OF THE INVENTION

According to the invention, there is provided a power plant comprising an energy converter for converting heat energy to another form of energy with use of a working fluid, and a heat exchanger for rejecting heat from working fluid, wherein the plant comprises a secondary circuit for providing coolant to the heat exchanger, said secondary circuit comprising:
  a store arranged to store coolant,
  a secondary heat exchanger for rejecting heat to ambient air,
  a coolant diverter,
  a controller configured to route coolant from the working fluid heat exchanger to:
  (a) the store in order to reject heat to the store,
  (b) the secondary heat exchanger, and to
  (c) choose (a) or (b) according to which provides more effective heat rejection from the coolant.

Because of the options available to the controller there can for example be effective heat rejection according to night-time ambient air, even during the day.

In one embodiment, the controller configured to direct coolant to the store when the secondary heat exchanger is incapable of reducing coolant temperature below a threshold.

In one embodiment, the controller is configured to direct coolant to the store when temperature of coolant returning from the secondary heat exchanger exceeds a temperature at which coolant may be drawn from the store.

In one embodiment, the diverter is configured to route coolant to an upper portion of the store.

In one embodiment, the secondary circuit is configured to, during (a), supply coolant to the working fluid heat exchanger from a lower portion of the store.

In one embodiment, the controller is configured to cause the secondary circuit to reject heat to the store during day-time and to reject heat by the secondary heat exchanger during night-time.

In one embodiment, the controller is configured to ensure that the secondary circuit coolant delivered from the store to the working fluid heat exchanger has been cooled to a temperature close to a minimum temperature of the previous night.

In one embodiment, the controller is configured to use the store only up to a time at which added heat can be, rejected in a single 24-hour period.

In one embodiment, the secondary circuit comprises temperature sensors arranged to monitor ambient temperature, temperature of the working fluid at the stage of heat rejection, and a thermal profile of the store.

Preferably, said threshold is variable.

In one embodiment, the controller is configured to set the threshold value according to local meterological data, a temperature profile of the store, and anticipated demand for heat rejection from the power generation plant.

In one embodiment, the controller is configured to direct the coolant to the store when temperature of the coolant returning from the secondary heat exchanger exceeds a store working temperature, and wherein said store working temperature is the temperature at a coldest part of the store after a most recent regeneration.

In one embodiment, the controller is configured to direct regeneration of the store by reducing temperature of coolant within the store.

In one embodiment, the controller is configured to direct simultaneous rejection of heat from power production into the working fluid and store regeneration, so that the store can be returned to a working temperature state during the coldest portion of the daily ambient temperature cycle.

In one embodiment, the controller is configured to direct regeneration for reducing temperature of the thermal store, in which commencement of regeneration begins when a calculated heat rejection capability of the secondary circuit heat exchanger approaches a quantity of heat which must be dumped by the end of the regeneration in order to fully regenerate the store.

In one embodiment, the controller is configured to dynamically set a target temperature profile for the store after regeneration.

In one embodiment, the controller is configured to vary flow rate of working fluid through the working fluid heat exchanger whenever a value for plant power output decreases below a set value or to reduce heat rejection temperature and cause an increase in power output.

In one embodiment, the thermal store includes baffles to reduce vertical flow of coolant within the store. In one embodiment, there is at least one baffle near a top part of the store. In one embodiment, there are baffles at both an upper end of the store and a lower end of the store.

In one embodiment, the store comprises a tank arranged to be mounted underground. In one embodiment, the store comprises a layer of insulation over a top wall of the tank.

In one embodiment, the controller is configured to simultaneously route coolant to both the store and to the secondary heat exchanger.

In one embodiment, the controller is configured to route coolant simultaneously to both the store and the secondary heat exchanger during a switchover phase in a gradual manner so that a portion of coolant flow is directed to the secondary heat exchanger is increased over time as ambient temperature drops.

In one embodiment, the power plant is a fossil fuel burning plant. In one embodiment, the system includes a cooler for cooling combustion air using coolant drawn from the store.

In one embodiment, the power plant comprises photovoltaic cells for converting solar power to electrical energy, and the working fluid is in a circuit for cooling said photovoltaic cells.

In one embodiment, the power plant further comprises a thermodynamic conversion plant for converting energy from heated working fluid to electrical power.

In another aspect, the invention provides a method of controlling a power plant comprising:
  a controller,
  an energy converter for converting heat energy to another form of energy with use of a working fluid, and
  a heat exchanger for rejecting heat from working fluid,
  a secondary circuit for providing coolant to the heat exchanger, said secondary circuit comprising:
    a store arranged to store coolant,
    a secondary heat exchanger for rejecting heat to ambient air, and
    a coolant diverter,
  wherein the method comprises steps of the controller routing coolant from the working fluid heat exchanger to the store in order to reject heat to the store, and/or to the secondary heat exchanger, for effective heat rejection from the coolant.

In one embodiment, the controller directs coolant to the store when temperature of coolant returning from the secondary heat exchanger exceeds a temperature at which coolant may be drawn from the store.

In one embodiment, the controller and the diverter route coolant to an upper portion of the store, supply coolant to the working fluid heat exchanger from a lower portion of the store, and cause the secondary circuit to reject heat to the store during day-time and to reject heat by the secondary heat exchanger during night-time.

In one embodiment, the controller directs regeneration of the store by reducing temperature of coolant within the store.

In one embodiment, the controller directs simultaneous rejection of heat from the working fluid and store regeneration, so that the store can be returned to a working temperature state during the coldest portion of the daily ambient temperature cycle.

In one embodiment, the controller routes coolant simultaneously to both the store and the secondary heat exchanger during a switchover phase in a gradual manner so that a portion of coolant flow is directed to the secondary heat exchanger is increased over time as ambient temperature drops.

Additional Statements

According to the invention, there is provided a power plant comprising an energy converter for converting heat energy to another form of energy with use of a working fluid, and a heat exchanger for rejecting heat from working fluid, wherein the plant comprises a secondary circuit for providing coolant to the heat exchanger, said secondary circuit comprising:
- a heat store arranged to store coolant,
- a secondary heat exchanger,
- a coolant diverter,
- a controller configured to route coolant from the working fluid heat exchanger to:
  (a) the heat store in order to reject heat to the store,
  (b) the secondary heat exchanger, and to
  (c) choose (a) or (b) according to which provides more effective heat rejection from the coolant, and possibly other factors.

In one embodiment, the controller is configured to direct coolant to the heat store when the secondary heat exchanger is incapable of reducing coolant temperature below a threshold.

In one embodiment, the controller is configured to direct coolant to the heat store when the temperature of the coolant returning from the secondary heat exchanger exceeds a heat store working temperature. Preferably, the controller is configured to direct regeneration of the heat store. In one embodiment, said heat store working temperature is the temperature of the store after a most recent regeneration.

In one embodiment, the diverter is configured to accumulate rejected heat in an upper portion of the store. In one embodiment, the secondary circuit is configured to, during (a), supply coolant to the working fluid heat exchanger from the lower portion of the heat store.

In one embodiment, the controller is configured to direct simultaneous rejection of heat from a power production cycle and discharge of heat accumulated in the store so that the store can be returned to working temperature state during the coldest portion of the daily ambient temperature cycle.

In one embodiment, the controller is configured to cause the secondary circuit to reject heat to the heat store during day-time and to reject heat by the secondary heat exchanger during nighttime. In one embodiment, the plant comprises a regeneration circuit for reducing temperature of the heat store.

In one embodiment, the controller is configured to cause the secondary circuit to deliver coolant flow from the secondary heat exchanger both to the working fluid heat exchanger and to the store during times when regeneration is required and the power plant is operational, the secondary heat exchanger having a capacity for performing said simultaneous heat rejection.

In one embodiment, the controller is configured to use the heat store only up to a time at which added heat can be rejected during regeneration. In one embodiment, the controller is configured to dynamically estimate additional heat rejection required and to continue to store heat in the store only while the regeneration heat rejection capacity or a large proportion thereof exceeds the required additional heat rejection.

In one embodiment, the controller is configured to automatically activate store regeneration if the capacity or proportion thereof falls below a required heat rejection.

In one embodiment, the mode of operation of the heat store is regulated by the controller using temperature sensors which monitor the ambient temperature, the temperature of heat rejection from the power cycle, and the thermal profile of the store.

In one embodiment, the controller is configured to ensure that the secondary circuit coolant delivered to the working fluid heat exchanger has been pre-cooled to a temperature close to the minimum temperature of the previous night.

DETAILED DESCRIPTION OF THE INVENTION

Brief Description of the Drawings

The invention will be more clearly understood from the following description of some embodiments thereof, given by way of example only with reference to the accompanying drawings in which:—

DESCRIPTION OF THE EMBODIMENTS

Figure 1:
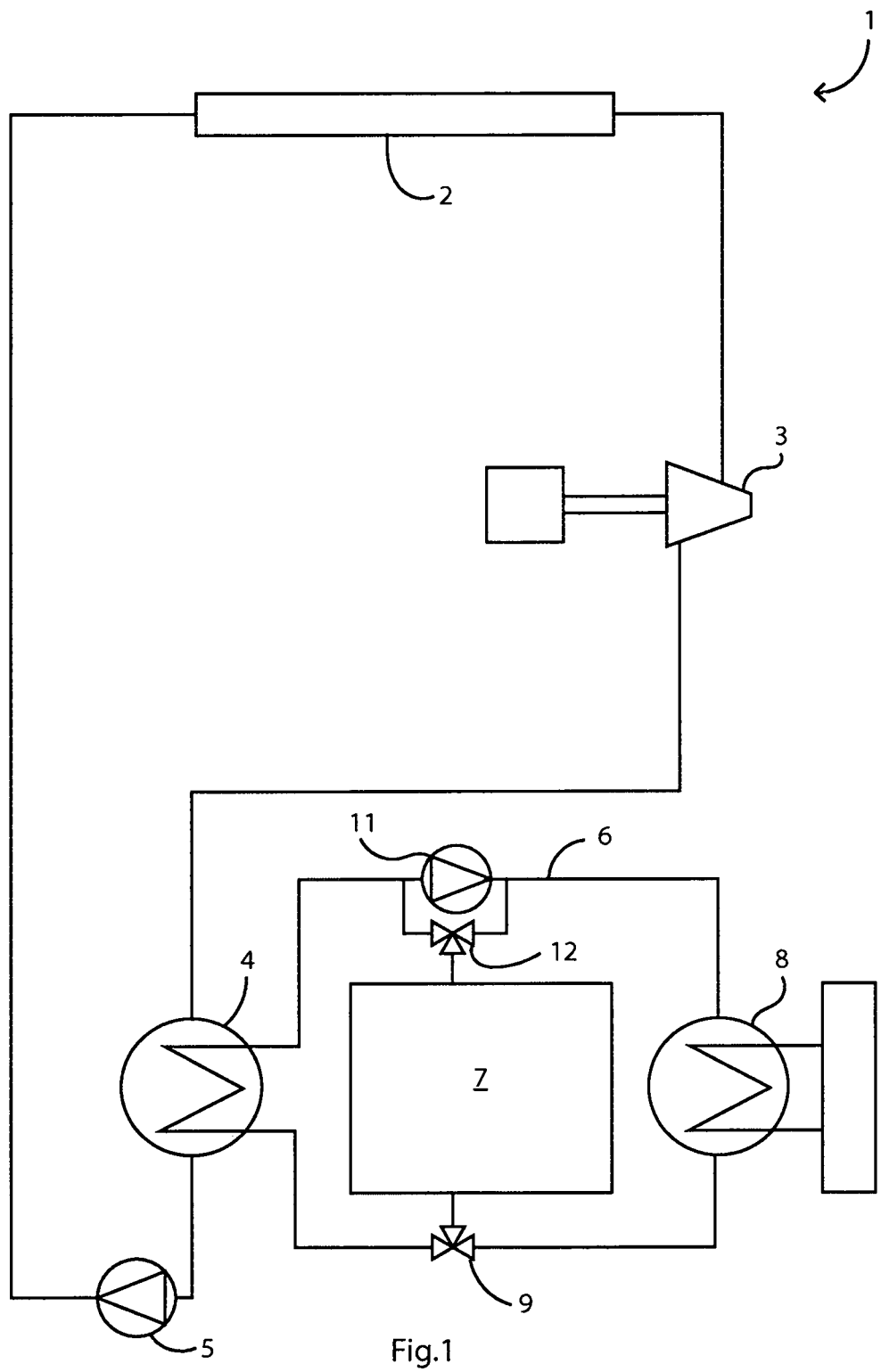
FIG. 1 is a diagram of a motive power plant of the invention.

Referring to FIG. 1 a motive power plant 1 comprises a heat intake element 2 at which heat is added to a working fluid. Heated working fluid flows from the intake element 2 to an expansion engine 3, and is used by the expansion engine 3 to provide motive power for an application such as electricity generation. The engine 3 extracts heat from the working fluid thereby lowering its temperature and pressure, and the lower-pressure and lower-temperature working fluid is routed to a heat exchanger 4 which extracts residual heat from it. A compressor or pump 5 then pressurises the working fluid and it is routed back to the heat intake element 2, where it is reheated.

The heat exchanger 4 is cooled by a secondary circuit including a pump and switch component 6 which routes coolant to either:
  (a) a heat exchanger 8 for rejection of heat from the coolant in the secondary circuit to ambient, or
  (b) to a thermal store 7, or
  (c) partly to the thermal store 7 and partly to the heat exchanger 8 when it is possible to reject only part of the plant heat output direct to the heat exchanger 8 without loss of efficiency.

The secondary circuit therefore can use the heat exchanger 8 during night time when ambient is coolest, and during the day the feedback to the working fluid heat exchanger 4 is coolant from the store 7 via valve 9. This provides 24-hour low temperature heat rejection. The thermal store 7 is re-generated at night. This regeneration again uses the heat exchanger at the same time as it is being used for the coolant coming directly from the working fluid heat exchanger 4. The heat exchanger 8 therefor needs to have a high capacity, and indeed in some embodiments it may be split into a number of units. And such units may be dedicated to one or other use.

In a preferred embodiment, the coolant is water.

Figure 2:
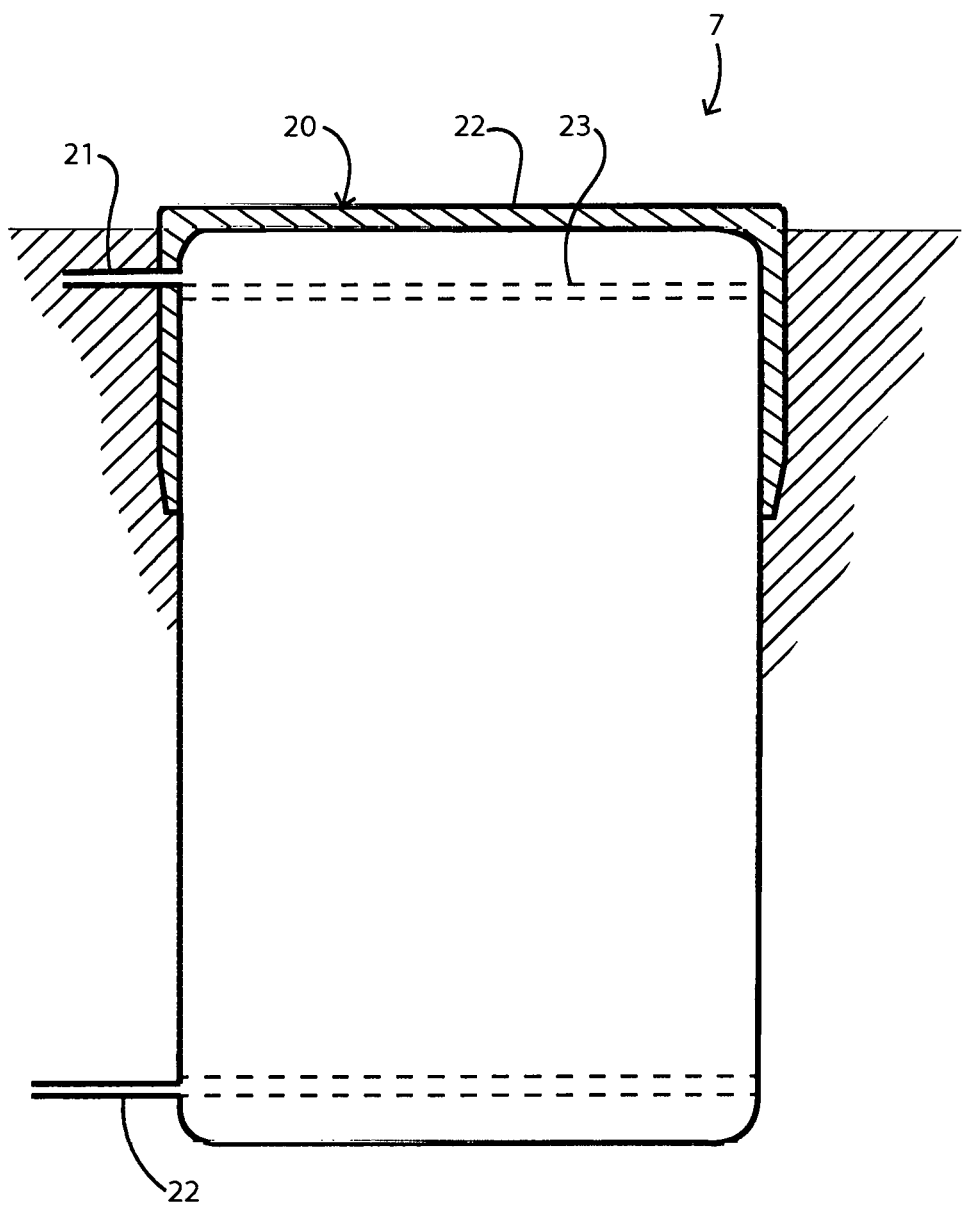
FIG. 2 is a cross-sectional view of a heat sink apparatus of the plant.

Referring to FIG. 2 the thermal store 7 is a large tank located underground, in this embodiment having a capacity of in excess of 100,000 m³. The secondary circuit coolant enters at the top of the tank 22 at an inlet 21 and exits at the bottom at an outlet 22 during the thermal charging period.

The decision to divert into the store 7 is taken according to the ambient temperature at which the secondary circuit heat exchanger 8 rejects heat.

A programmed controller directs the coolant to the store 7 via the valve 12 and draws coolant from the store via the valve 9 when it is more efficient to do so than to route it through the heat exchanger 8. This is typically during the day. During this time the store 7 completes a path from the valve 12 through the valve 9 and back to the working fluid heat exchanger 4.

If the store is located underground the surrounding ground becomes effectively an extension of the store, with its temperature equalising with that of the lower part of the store.

There will typically be a marginal intermediate time when the controller should switch from routing the coolant through the store 7 to through the heat exchanger 8. In a preferred embodiment, the controller is configured to switch to the heat exchanger 8 at an early time in this intermediate stage, as this avoids the need for an excessively large heat store and also optimises the opportunity to regenerate the store. This switchover may also be made in a gradual manner so that the portion of the flow sent to the heat exchanger 8 is increased over time as the ambient temperature drops. This procedure allows a smooth temperature profile to be maintained in the flow of coolant fluid entering heat exchanger 4.

In more detail, the components 6 include a pump 11 and a diverter valve 12 linked to an electronic controller, not shown. Coolant fluid in the secondary circuit is circulated by the circulation pump, 11. When the temperature of the coolant returning from the ambient heat exchanger 8 exceeds the thermal store 7 working temperature i.e. the temperature of the thermal store after its most recent regeneration, the rejected heat is accumulated in the upper (warmer) portion of the store. Coolant is supplied to the heat exchanger 4 from the lower portion of the store 7 (via the outlet 22) whose temperature remains close to that of the night time minimum temperature. The secondary circuit also permits simultaneous rejection of heat from the power production cycle and discharge of heat accumulated in the store 7 so that the store can be returned to its minimum (working) temperature state during the coldest portion of the daily ambient temperature cycle.

The mode of operation of the thermal store 7 is regulated by a controller using temperature sensors which monitor the ambient temperature, the temperature of heat rejection from the power cycle and the thermal profile of the store 7. This information is used to control the operation of the circulating pump 11 and the three-port valves 9 and 12 to maximise the efficiency of the power generation process. The efficiency of the power generation process is maximised by ensuring that the coolant delivered to the heat exchanger 4 has been pre-cooled to a temperature close to the minimum temperature of the previous night. The thermal store maintains thermal stratification to ensure that the secondary circuit coolant is withdrawn from the coldest part of the store 7, the lower end.

It will be appreciated that the heat rejected from the power cycle throughout the day is rejected at a temperature close to that of close to the coldest part of the night. Meeting this requirement will determine the heat storage capacity of the low temperature heat store 7 and the power handling capacity of the ambient heat exchanger 8. The result will be more stable operation of the thermal power plant 3 and improved output and efficiency during the hotter part of the daily temperature cycle.

The invention is applicable to thermal power generation plants 3 which rely on ambient air cooling and are thereby exposed to the full range of the diurnal temperature swing. It is most effective for power plants sited in locations with high diurnal temperature variations, especially above 20K. Another factor which influences the effectiveness of the invention is the heat inlet temperature of the bottoming thermal cycle, i.e. the cycle whose heat is rejected to the ambient. This is apparent from the mathematical form of the Carnot factor. A decrease of 20K in the heat rejection temperature will have a larger effect on the efficiency of a cycle with an intake temperature of 130° C. than on one with an intake temperature of 600° C. The precise size of this benefit will depend on details of the particular power cycle being used, but indications from the trend of the Carnot factor show potential efficiency increases for plants in hot dry locations of about 2.0% to 5.0% over the above range of intake temperatures when the heat rejection temperature is reduced by 20K.

The greatest gains from application of the system of the invention are to be found in power plants operating with the lowest heat intake temperatures. Low intake temperatures are most likely to be found in solar thermal, geothermal and waste-to-energy power generation facilities. Another application for the invention is in the production of power from power plants in which the "working fluid" is not directly doing work, but is rather contributing to the energy-providing components. An example is a photo-voltaic system in which the "working fluid" actively cools the solar cells, thereby allowing them to function.

An example is a concentrated solar flux power plant using photovoltaic energy conversion (CPV, mirror-concentrated solar PV). Power generation from solar CPV requires efficient dissipation of the non-converted part of the incoming solar flux. More than half of the incident solar energy is converted to heat, even in highly efficient solar CPV installations. The efficiency of the photovoltaic energy conversion process is known to be reduced by any increase in the temperature of the solar energy absorber. Measurements have shown reductions of more than 20% in the photovoltaic conversion efficiency of composite CPV receivers over an operating temperature range from 30° C. to 130° C. Hence the system of the invention could be used either to enhance the photovoltaic conversion efficiency by reducing the working temperature of the receiver as far as possible or by making it practical to interpose a secondary thermal power cycle between the photovoltaic receiver heat sink and the low temperature thermal store of the system of the invention.

The invention is also is able to deliver significant performance benefits when applied to air cooled fossil fuelled power plants, typically using steam cycles with intake temperatures in the neighbourhood of 600° C. These benefits would apply only to the bottoming cycles when the system is applied to combined cycle plants.

The air cooled heat exchanger 8 of the secondary circuit is a considerably more compact and less costly assembly than an air cooled condenser, particularly when compared to an air cooled steam condenser operating substantially below atmospheric pressure. In addition, the air cooled heat exchanger 8 will operate in the more favourable thermal conditions of night time ambient, taking full advantage of the higher density and lower temperature night time air.

Thermal Store

The thermal store 7 preferably comprises a volume of water contained in a storage vessel, a tank or a cavern forming part of a closed fluid circuit. The vessel is provided with connections to allow heat to be added or removed by circulation of the water volume as required. The fact that this store will operate at temperatures near night-time ambient temperatures means that only minimal thermal insulation will be required. The fact that this store can be located partly or fully underground means that it can be designed to have a negligible physical footprint on the site. The inherent simplicity and flexibility of the system of the invention presents an opportunity to improve both the output and the cost effectiveness of many types of power generation plants sited in locations with adequate diurnal temperature ranges.

The thermal store has a range of working temperatures determined primarily by the lower limit of the diurnal temperature swing. Typical lower working temperatures for the store would lie in the interval between 5° C. and perhaps 15° C. The storage capacity is determined by the power rating of the plant it serves, the upper working temperature of the store, the daily operating pattern of the plant and the portion of the total daily heat rejection which is to be retained in storage. The upper working temperature of the store is selected to allow the most efficient thermal storage while keeping the daytime heat rejection temperature as low as possible. A typical value of the upper working temperature would be in the range of 10K above the lower working temperature. Increasing the storage capacity will allow fuller use to be made of the available daily temperature swing by allowing the use of reduced lower working store temperatures. It will also require increased power handling capacity of the ambient heat exchanger, 8, to allow full thermal discharge to be completed during the time period available for heat rejection. This ability will also require the heat store to be discharged at a substantially higher rate than when it is being charged.

The thermal store described in these embodiments is based on what is known as "sensible" heat storage, i.e. the coolant does not change phase, but does change temperature. In one example it is water, the temperature of which changes. On the other hand latent heat storage is a possibility, but is not preferred. Latent heat storage may for example use a wax-like substance which freezes and melts at a convenient temperature, absorbing or releasing latent heat in the process.

The thermal store can be based on either sensible or latent heat storage. The high probability of unequal charging and discharging time intervals tends to favour a sensible heat store. The rates of charge or discharge of a sensible heat store can easily be adjusted by use of variable speed pumps and fans. The storage element could be based either on a single temperature-stratified tank or on a twin tank configuration. The single tank configuration usually has size and cost advantages, provided that adequate temperature stratification can be maintained within the storage volume. This is particularly important where the differences between the upper and lower working temperatures of the store are likely to be in the tens rather than hundreds of degrees and where the need for thermal insulation of the store is expected to be minimal.

The thermal store is preferably located near the power production equipment. A preferred placement for the store would be at least partly underground. This choice will allow the store dimensions to be selected so as to provide good thermal stratification. This location also enables the store to be operated under positive pressure without incurring the expense of large pressure-rated vessels which would otherwise be required. It will also minimise the need for thermal insulation.

The invention includes in some embodiments features to enhance the effectiveness of the store. The uppermost part of the thermal store may in some circumstances be exposed to diurnal temperature variations which can give rise to undesirable heat flows into the store, particularly during summer months. This exposure can be counteracted by the addition of a suitable level of thermal insulation over the top and the uppermost lateral parts of the store. On the other hand the lower portions of the store are likely to extend to depths in tens of metres below ground level, depending on the site particulars. These lower surfaces will be in contact with an environment whose temperature remains virtually unchanged over the yearly cycle at a value close to the yearly mean temperature of the site. Sites at low latitudes would be expected to have yearly mean temperatures in the vicinity of 20° C. Hence it may be possible to augment the useful heat storage capacity of the system by purposeful design of the lower portion of the thermal store. The invention provides for the use of materials and construction techniques to provide enhanced thermal contact between the store and its surroundings in the lower regions of the store in order to increase its effective thermal storage capacity over that available from the stored liquid alone. This additional storage capacity will provide a certain amount of seasonal heat storage, allowing some carryover of winter season low temperatures to the summer period when the demand for low heat rejection temperatures is at its peak. The effectiveness of measures for increasing the capacity of the low temperature store will vary with site and application particulars. The advisability of any such measures is to be determined from specific feasibility investigations including geothermal heat flow calculations carried out at each contemplated site.

The preferred storage medium for the low temperature thermal store is water or a water-based mixture, a choice based on a number of criteria. Water remains liquid over the full range of anticipated operating temperatures. It has a positive thermal expansion coefficient down to approximately 4° C., enabling thermal stratification down to this temperature. It is stable, nontoxic, inexpensive and is readily treatable to be nonaggressive toward materials with which it may come into contact.

As noted above, FIG. 2 illustrates one preferred arrangement for the low temperature storage. The liquid container is shown as a single vessel, 20, located mostly underground. The vertical and horizontal measurements of the storage volume are shown as comparable for illustration purposes. Baffles 23 at the upper and lower extremities are provided to dissipate any significant vertical fluid movements within the storage volume, regardless of how rapidly the liquid is pumped through the vessel. Insulation 22 is shown in a layer covering the uppermost portion of the storage volume only. The insulation coverage is intended to provide thermal isolation of the storage vessel only down to a depth which could be materially affected by diurnal temperature swings.

At depths beyond the limit of significant day-to-day ground temperature fluctuations, thermal contact between the liquid thermal store and its surroundings can provide a valuable increment to the thermal storage capacity. The design of the thermal store provides a means to avail of this effect whenever it can be established that this feature can make a practical positive contribution to the operation of the system.

A number of construction techniques can be used for the storage container or containers. These include prefabrication in metal, concrete or plastics; on-site vessel fabrication or lined cavern construction. Multiple storage vessels located at equal depth would preferably be piped in parallel arrangement in order to minimise flow resistance and to avail of any possible storage enhancement by thermal coupling to the geological surroundings. The particular solution best adapted to a particular site will be determined by a plant design study. The scope of the invention extends to the use of all techniques in regular use to store and produce thermal stratification in contained liquid volumes.

The general magnitude of the low temperature store is illustrated by a specific example. The example is based on a single steam Rankine cycle air cooled parabolic trough solar thermal power station with an electrical output rating of 100 MW. This type of power station will have a typical condenser heat rejection of about 1.4 kWh thermal per kWh of electrical power produced when rejecting heat at temperatures near 30° C. The station is assumed to have sufficient high temperature storage to enable it to produce power for at least the full duration of daylight. The thermal store 7 is to have sufficient capacity to absorb the full heat rejection load during the hottest 8 hours of the day with a maximum temperature rise of 10K between its fully charged and fully discharged states. The total plant output is assumed to be 80% of the rated power output over the 8 hour period. No allowance is made for any useful augmentation of the thermal storage capacity by phase change materials or geothermal or other techniques. The water volume of a thermal store to meet this requirement is approximately 100,000 m$^3$. It is clear from the details of the example that this storage requirement could be substantially reduced by realistic changes in most of the numerical values assumed. Even in this demanding application the physical parameters of the thermal store are broadly commensurate with the scale expected of the assumed generating plant. Moreover the thermal store dimensions are broadly similar to those of high temperature thermal stores used to extend the operating hours of solar thermal power generating stations beyond the hours of adequate solar energy input.

Secondary Circuit Heat Exchanger and Thermal Store Regeneration

The secondary circuit heat exchanger (8 in the embodiment of FIG. 1), will need to function at high efficiency over a wide range of heat exchange loads in order to make best use of the available diurnal temperature range. The minimum daily temperature in hot dry regions tends to occur near sunrise. The time profile of ambient temperature during the coldest hours is usually asymmetric since the gradual temperature decline due to night time long wavelength radiation cooling is reversed by the considerably stronger influence of direct solar radiation which produces a considerably more rapid temperature rise rate. Night time radiation cooling in desert climates is typically in the range of 100-150 W/m$^2$ whereas solar radiation rises rapidly after sunrise to levels in the range of 700-900 W/m$^2$. One result of this characteristic is that the time for terminating the dump of stored heat (regeneration) is relatively well defined (very shortly after sunrise) whereas the optimum time for initiating the heat dump process is considerably more difficult to identify.

A process control system with adaptive capabilities is preferred to select the optimum regeneration cycle start time. This decision may be made by program logic using as inputs weather information, the temperature profile of the thermal store and the current and anticipated power production up to the end of the regeneration time. An advantageous capability for effective functioning of the thermal store regeneration process is efficient heat rejection across a broad power spectrum by the secondary circuit (coolant) heat exchanger. This objective is in some embodiments best achieved using a heat exchanger with fully modulating fan speed control and a heat exchange block configured to minimise the parasitic power consumption over the full range of heat rejection duties required. One preferred layout for a heat exchanger to carry out this duty is a horizontal tube array with appropriate extended surfaces and a vertical draft fan system. Heat exchangers of this general arrangement are widely used in thermal power applications where large amounts of heat are rejected to the ambient.

Operation, More Detail

The functioning of the system of the invention is now described in more detail, over the course of a single operating day.

The first part of the operating cycle commences when the ambient temperature rises above the level set as the upper limit for direct rejection of cycle heat to the ambient. Typically this would occur shortly after sunrise. The precise time will depend on the climatic data for the particular site. At this time the secondary circuit shuts off flow to the heat exchanger (8) and shuts down its fans. If power generation is not taking place at this time the circulation pump 11 is also shut down to avoid wasteful power consumption. If power is being generated, the coolant in the condenser 4 enters the upper part of the thermal store 7 thereby depositing heat in the thermal store. Pre-cooled fluid is withdrawn from the bottom part of the store and is pumped through the condenser 4 to absorb heat from the power cycle. The stratification of the thermal store 7 ensures that the warmed fluid entering at the top does not mix with the cooled fluid below. Thus the uppermost part of the low temperature heat store begins to accumulate heat rejected from the power generating cycle. This mode of operation continues either until power production ceases or until the ambient temperature drops to the level set to allow direct rejection of heat to the atmosphere. If power production ceases, the secondary circuit flow is halted and the fans on the ambient heat exchanger 8 are switched off after a suitable interval to prevent unnecessary parasitic power consumption and dissipation of the low temperature heat storage.

The second part of the operating cycle begins when the ambient temperature drops below the level set to permit direct rejection of heat to the ambient. If power production continues after this time, the valve settings are changed to direct the flow from the condenser 4 to the ambient heat exchanger 8 allowing rejected cycle heat to be transmitted directly to ambient air. This change would also activate the fans in the heat exchanger 8 as required for efficient heat dissipation. No part of the secondary circuit flow would pass through the thermal store 7 during this part of the operation.

This part of the operating cycle would typically begin at a time after sunset when the ambient temperature has dropped substantially below its daytime peak and the ambient air cooling rate has dropped to a level near that prevailing during night time. At this time the power generation benefit accruing from continuing use of the low temperature store will have become marginal since the temperature advantage of using the low temperature store will have dropped to a small fraction of the diurnal temperature range. In addition, the continuing accumulation of heat in the thermal store 7 will add to the total quantity of heat to be rejected from the store, necessitating an earlier start to the regeneration phase and thereby raising the achievable regenerated store temperature above the level that would otherwise be possible to achieve.

The time for commencement of the direct heat rejection phase can be determined by a variety of techniques. One simple and direct method is based on the heat rejection temperature achieved by direct rejection to ambient versus that achieved by heat rejection to the thermal store. As an example, the rejection of heat direct to the ambient could commence when the heat rejection temperature advantage of using the thermal store 7 rather than direct heat rejection would decrease below some specified value, e.g. 1.0K. Another method for initiating the second part of the operating cycle is to make a gradual changeover of the flow from a path through the store 7 to one through the heat exchanger 8. In this method the flow reapportionment can begin preferably as soon as the ambient temperature drops marginally below the temperature of the regenerated (i.e. the lowest) part of the thermal store. At this time it is possible to reject only a small portion of the power plant heat output via heat exchanger 8 without causing a rise in the temperature of the coolant returning from heat exchanger 8 above the temperature in the regenerated part of the thermal store. As the ambient temperature decreases, the portion of the coolant routed through heat exchanger 8 can be increased without a temperature rise. This process continues until the full flow of coolant coming from heat exchanger 4 is routed through heat exchanger 8 and the flow through the store 7 ceases. More complex methods for determining the initiation of direct heat rejection based on maximising the total power generation, or the peak power output or the overall power generation efficiency over the entire daily operating cycle are clearly possible to implement.

Inclusion of the direct rejection phase as part of the daily operating cycle is essential to provide the flexibility required to deal with day-to-day weather variation and the differing climatic and plant operating conditions encountered over the course of yearly operation. Inclusion of the direct rejection phase is also essential to avoid oversizing of the heat store and to achieve cost-effective design of the system.

The third part of the operating cycle involves the regeneration of the thermal store by discharging all of the heat accumulated in the thermal store during the earlier parts of the operation. The time when this part of the operating cycle of the system of the invention is initiated will depend on 1) the scheduled or anticipated power production of the plant for the remaining part of the daily operating cycle of the system of the invention; 2) the quantity of heat accumulated in the thermal store, and 3) the time remaining and the anticipated ambient temperature profile until the ambient temperature is expected to rise above the maximum level permitted for thermal regeneration of the store. The controller is programmed to use the above information in addition to the component performance capabilities and current weather data in order to determine the optimum time for initiating the thermal regeneration part of the operating cycle.

Two modes of operation are possible during the thermal regeneration part of the operating cycle. The first mode applies if no power is being produced by the power generation circuit. In this case the secondary circuit is arranged to remove heat solely from the thermal store, 7, and deliver it to the ambient heat exchanger 8, for dissipation into the ambient air. This is readily accomplished by closing the port facing toward the condenser 4 on the lower three-port valve 9 and the port facing toward the heat exchanger 8 on the upper three-port valve 9. The speed settings on the circulating pump 11 and on the fans serving the heat exchanger 8 are determined in order to achieve the required heat dissipation with minimum energy consumption during the time available for thermal regeneration.

The other possible mode of operation during this part of the operating cycle is one in which power continues to be produced during the heat store regeneration cycle. This mode requires heat taken both from the power cycle via the condenser 4 and from the thermal store 7 to be dissipated simultaneously by the ambient heat exchanger 8 into the ambient air. In this situation the lower three-port valve 9 will be adjusted to apportion the thermal pickup flow between the condenser 4 and the thermal store 7 so that the heat rejection temperature from the power cycle is maintained at the desired value. As in the situation described immediately above, the upper three-port valve remains positioned to direct the flow from the thermal store 7 to the inlet side of the circulating pump 11. The system controller must determine the optimum time to initiate the heat store regeneration operation taking into account not only the heat accumulated in the low temperature heat store but also the heat being rejected during the on-going power production. The design of the low temperature heat store 7 and especially of the circulating pump 11 and the ambient air heat exchanger 8 must provide adequate capacity to carry out this operation in any applications where the possibility of continuous power production exists.

It is clear that the thermal regeneration process for the store 7 cannot be allowed to continue beyond the anticipated time when the ambient temperature rises above the level set for heat rejection to the ambient. This is because the rate of ambient temperature rise shortly after sunrise is normally much higher than the rate of ambient temperature decrease in the hours preceding sunrise. Commencement of the regeneration cycle too early will result in a less effective regeneration profile in the low temperature store, resulting in higher store temperatures generated in the early portion of the regeneration cycle. Commencement of the cycle too late will result in incomplete regeneration of the store, with some of the accumulated heat still left in place in the thermal store at the beginning of the following day's cycle. Hence, an accurate method for determining the optimum time for initiation of the thermal regeneration cycle is advantageous for efficient operation of the system of the invention. The optimum start time for the regeneration occurs when the quantity of heat which must be rejected by the end of the regeneration cycle becomes equal to the potential heat rejection capacity of the system up to the same termination time.

Accurate determination of the regeneration cycle onset will require continuous recalculations of the thermal quantities involved while the ambient temperature drops and the time available for cycle completion decreases.

Control Logic

Figure 3:
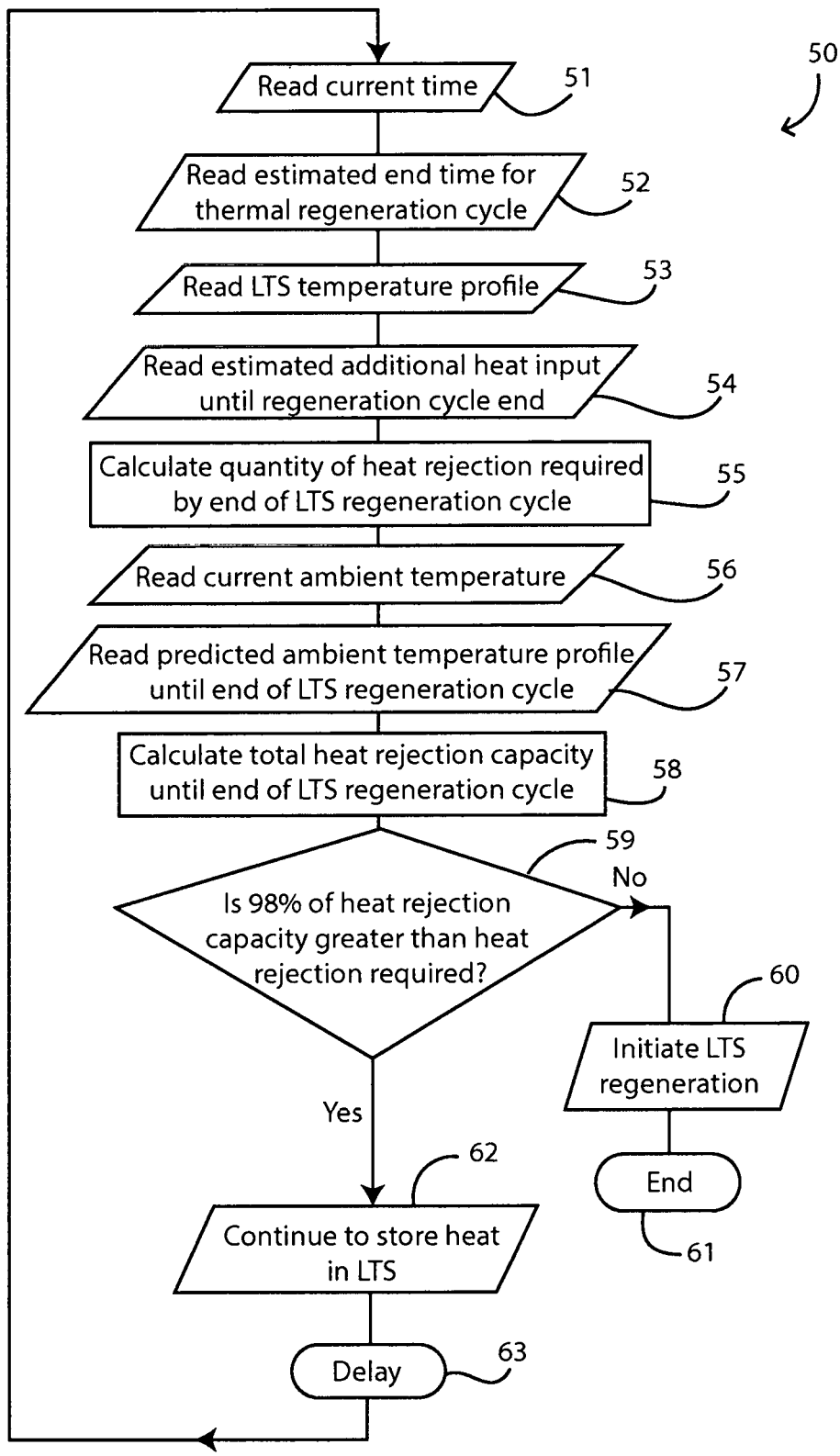
FIG. 3 is a flow diagram for operation of a controller of the plant.

FIG. 3 illustrates a control method in which the thermal regeneration process is commenced when the quantity of heat to be dissipated to ambient exceeds 98% of the calculated rejection capacity in the time remaining for regeneration of the store. This is one example of a number of criteria which could be adopted to ensure that the benefits of the system of the invention are fully realised.

The steps of the method 50 of FIG. 3 are, in detail:

51, Loop starts with a current time reading.

52, Determine estimated end time for the thermal regeneration cycle, from a weather profile including archived site weather records, sunrise time and local short term weather forecast

53, Read a temperature profile for the low temperature store (LTS).

54, Determine from projected power demand information the estimated additional heat to be rejected to the ambient until the end of the regeneration cycle.

55, Calculate by addition of the heat stored in the store and the estimated additional heat to be rejected from power generation the quantity of heat rejection required by end of the regeneration cycle end.

56, Read current ambient temperature.

57, Determine from archived site weather records, sunrise time and local short term weather forecast an ambient temperature profile until the end of the store regeneration cycle.

58, Calculate by combining the ambient temperature profile with the characteristics of the ambient heat exchanger and secondary pumped liquid circuit the total heat rejection capacity available until the end of the store regeneration cycle.

59, Determine if 98% of the heat rejection capacity is greater than the heat rejection required. If so continue, 62, to store heat in the thermal store or to reject heat from the power cycle direct to the ambient, followed by a pre-set configured delay 63 until the next loop start. If not, initiate, 60, thermal store regeneration and end at 61.

After the completion of the regeneration cycle there may be a time interval when heat could be rejected directly to the ambient from power being generated at the time. This could occur, for example, if cloud cover or wind or other climatic feature intervened to reduce the early morning ambient temperature rise rate. In particular sites where this type of behaviour could be encountered on a regular basis a direct rejection phase could be incorporated in the system after completion of the thermal regeneration phase using the design features discussed in relation to the second part of the daily operating cycle.

A motive power plant sited in a hot and dry location with an adequate diurnal temperature variation will be able to avail of performance increases by incorporating the system of the invention. The largest performance increases are to be found in plants using the lowest heat intake temperatures. Increases in the Carnot factor range from approximately 5% for low temperature cycles taking in heat at 130° C. to 2.0% for cycles taking in heat at 600° C. Improvements in the performance of actual plants by incorporation of the system of the invention can be significant since actual plants perform at levels well below the Carnot factor limit and generally reject less condenser heat than would their ideal counterparts.

The benefits of the system of the invention are not limited to the performance increases noted above. Additional benefits are obtained from stabilised plant operation over the 24 hour day and the reduction or elimination of on-going water consumption by the plant.

Control Logic: Variable Regenerated Fluid Temperature in the Low Temperature Thermal Store The operation of the thermal store for thermal power generation has been based on the assumption of the store achieving a certain minimum temperature during the regeneration phase and a second, higher temperature after absorbing heat from power production by the plant. The difference between these two temperatures is related to the Diurnal Temperature Range (DTR) at the site being considered as well as a number of other factors. A value of 10K has been used, for purposes of illustration.

There are other options available which may be advantageous in certain situations. One is the possibility of using a variable temperature for the stored liquid being regenerated. The temperature profile of the regenerated store contents would begin at a slightly higher value and drop over a few hours to the target regenerated fluid temperature. This option would allow the regeneration process to be started earlier, provided that the initial regeneration temperature was allowed to be higher than the final regeneration temperature by a selected amount. When the regeneration of the thermal store is complete its uppermost portion would have a slightly higher temperature than the lower portion of the store.

This option allows more flexibility on the operation of the store. It makes possible a longer duration of the regeneration cycle and hence reduces the peak heat rejection demand on the secondary heat exchanger. This can result in a reduced sizing of the secondary heat exchanger and thereby an improved cost effectiveness for the system.

The usefulness of this feature arises from the fact that the daily ambient temperature profile generally exhibits a slow rate of decrease after sunset toward its minimum, which tends to occur near sunrise. As a result of this slow drop, it may be possible to begin the regeneration phase as much as an hour or more earlier if the initial target regeneration temperature is raised by a small amount, for example 1K to 3K. This feature will be most valuable for installations where power is produced during a considerable part of the night time hours and where a longer regeneration period will avoid possible oversizing of the secondary heat rejection equipment.

This feature can be incorporated into a system using a low temperature sensible heat store with minimal impact on plant operation. A slightly higher initial regeneration temperature will not disrupt the stratification of the store since the lowest density fluid will remain in the uppermost part of the regenerated portion of the store. Also, this slightly warmer regenerated fluid will be the last to be used to absorb heat on the following day, i.e. it will be used at the end of the store charging phase when the need for use of the thermal store is approaching its minimum.

Control Logic: Variable Heated Fluid Temperature in the Thermal Store

The upper working temperature of the thermal store is set primarily to limit the heat rejection temperature of the power plant to the lowest feasible value. The temperature rise which occurs when the stored fluid passes through the heat rejection element of the power plant is generally that which takes place when the plant is operating at its rated capacity. Actual operation of power plants includes many instances when the output may vary substantially from the rated or design value.

The system of the invention may provide additional flexibility to the plant operation by varying the flow rate of fluid through the power plant heat rejection element. The plant controls can be arranged to reduce flow through the heat rejection element whenever the plant power output decreases below its design value. This will reduce the draw on the low temperature stored fluid and may lead to more efficient system design. Another option is the ability to increase the flow rate, resulting in a reduced heat rejection temperature and an increased power output. This ability provides a method for increasing the plant power output by increasing the power-extracted from a fixed plant energy input. This option may be of interest when the production of additional power on request may be a useful capability for the plant operation.

Using the figure of 10K as the nominal temperature rise of the thermal store water which picks up reject heat from the power station, it may be feasible to vary the plant heat rejection temperature by as much as 15K if the flow rate in the loop joining the store and the power plant heat rejection element is able to be varied between a halving and a doubling of the nominal flow rate. The usefulness of this capability, either in conjunction with or in addition to the other plant output control capabilities will depend on site specifics.

This option will give rise to temperature variations in the heated part of the low temperature store. These variations may give rise to convection currents within the heated portion of the store, which will tend in general to homogenise the fluid temperature in this region. The regenerated portion of the store is unlikely to be disturbed by this effect, leaving the function of the low temperature store substantially unaffected.

The ability to influence plant output by this means may provide a useful additional capability of the system in power stations where a high degree of dynamic output control is an important attribute.

Power Plants: CO as the Working Fluid

The invention may be applied to power plants which use the supercritical fluid cycle, most commonly with $CO_2$ as the working fluid.

In this embodiment the widening of the working temperature interval by the system of the invention provides an additional benefit to the plant, as it allows the plant to operate in condensing mode at all times during the diurnal cycle.

The low critical temperature of $CO_2$ limits condensing power cycles using this fluid to those able to reject heat at temperatures below approx. 31° C. Air cooled power plants sited in hot dry locations using the supercritical $CO_2$ cycle will be unable to achieve condensing operation whenever ambient temperatures rise above approximately 20° C. This limitation can serve to inhibit the application of this power cycle or to increase the cost and complexity of equipment needed to cater for two types of heat rejection.

Incorporation of the system of the invention in a supercritical $CO_2$ power plant sited in an appropriate climatic zone will widen the working temperature range of the plant, conferring on it the advantages described earlier. In addition, the reduction of the heat rejection temperature will allow the plant to be operated full time in a condensing (Rankine-type) cycle rather than in a mixed mode regime involving both Rankine and Brayton cycle types. It is well known that much less energy is required to compress a liquid than a gas. This can result in an additional performance benefit resulting from application of the system of the invention.

This simplification of the operating cycle will offer both capital cost advantages and operating efficiency gains to power generation systems using the supercritical $CO_2$ cycle. This embodiment also applies to other working fluids including $C_2H_2$, $C_2H_6$, and $N_2O$ and appropriate mixtures of them which could be used as working fluids in place of $CO_2$ in supercritical power generating applications.

Power Plants: Fossil-Fuelled Plants

Figure 4:
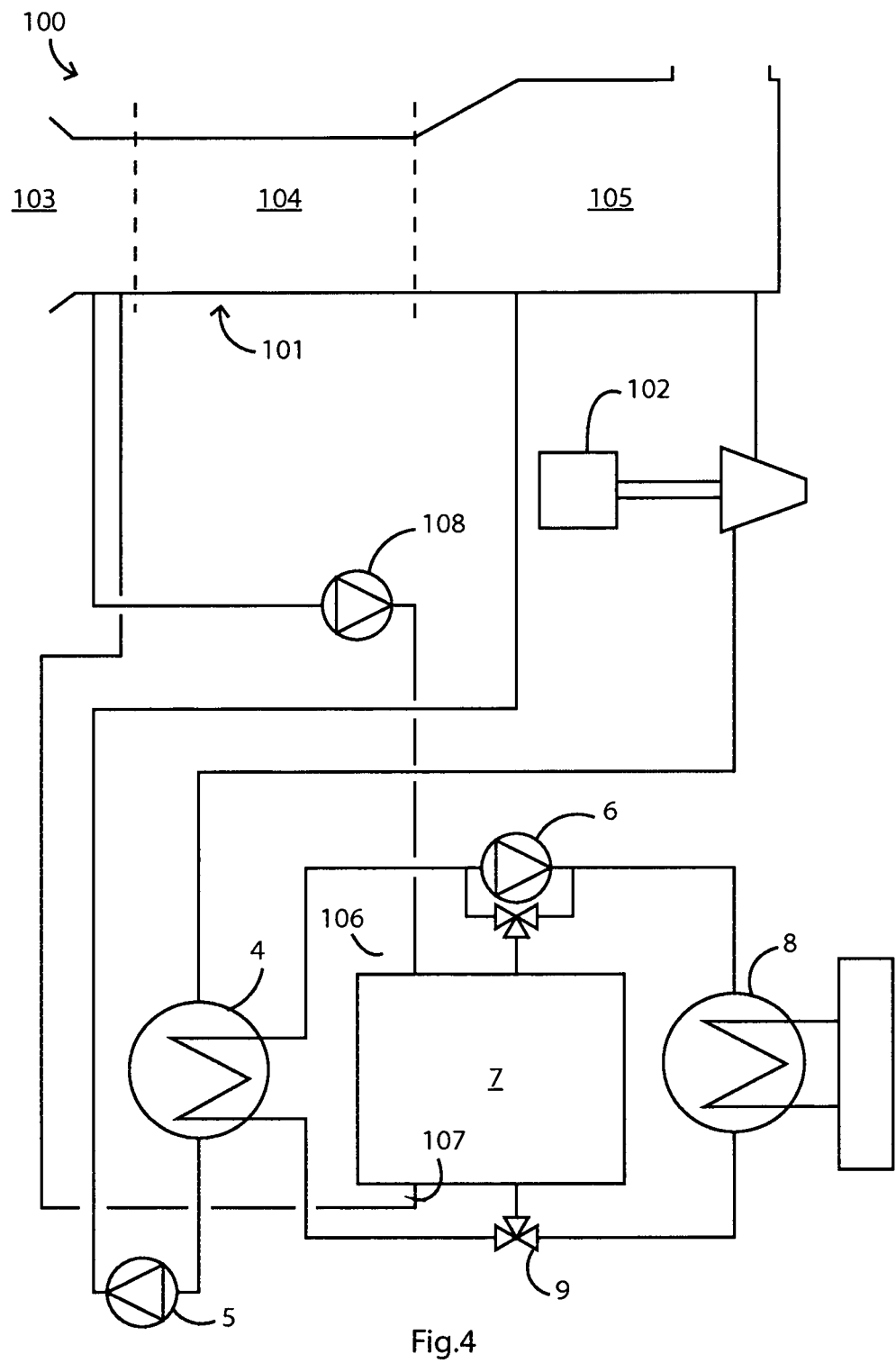
FIGS. 4 to 6 are diagrams illustrating alternative motive power plants of the invention.

The invention may also be part of a fossil-fuelled combined cycle power generation plant. In this embodiment the invention both widens the working temperature range of the bottoming cycle and provides cooling for the combustion intake air stream serving the topping cycle. The first role contributes to the increased efficiency of the aggregate plant by improving the performance of the bottoming cycle. The second role provides an additional improvement to the aggregate plant performance by providing energy-efficient cooling for the incoming combustion air and thereby avoiding the drop in system output and efficiency which otherwise would accompany increasing ambient temperatures. The general arrangement of components in this embodiment is shown in FIG. 4. An envelope 101 containing the combustion process elements and exhaust gas heat exchanger is divided into three sections: an air intake and air intake cooling section 103; a gas turbine section 104; and an exhaust gas heat exchanger or heat recovery steam generator (HRSG), 105.

The bottoming cycle, normally a steam Rankine cycle, is generally as described in the previous embodiment. In this embodiment the thermal store has an additional pair of connections 106 and 107 which provide chilled water from the store to a closed circuit inlet air cooling coil, 103. A pump 108 supplies the desired flow of chilled liquid to the cooling coil located in the path of the combustion turbine air inlet. Preferably the pump 108 is equipped with variable speed capability to allow energy-efficient regulation of the pumping power used to provide inlet air cooling. The inlet air cooling feature will be used only to the extent needed to maintain plant output at desired levels during times of increased ambient temperature. The availability of variable combustion inlet air cooling may be used also as part of the overall plant output control.

The production of the cooling effect in this system is both energy-efficient and water-efficient. The cooling is generated without any mechanical refrigeration and without any consumption of water. The system allows for the insertion of an auxiliary mechanical refrigeration unit to provide additional cooling in situations where it may be deemed advisable to provide chilled liquid at temperatures lower than those obtainable from night time heat rejection alone. Additional inlet air cooling could be provided by inserting a refrigeration unit between the flow and return pipes serving the inlet air cooling coil, cooling the liquid entering the coil and heating the liquid returning to the low temperature store. This optional feature is not depicted because it is not an essential feature of the system of the invention and because its function and placement in the figure would be clear to a person skilled in the art.

It is clear that even if auxiliary mechanical cooling is used, the bulk of the inlet air cooling effect is obtained from the night time heat rejection process and benefits substantially from it by way of a major reduction in the overall cooling energy expenditure. The closed loop nature of the cooling system ensures that the system provides its cooling without relying on the water consumption needed to provide evaporative cooling.

The size of the thermal store and the capacity of the heat rejection equipment used to dissipate cycle heat into the ambient will need to be determined according to the needs of both the bottoming cycle heat rejection and the topping cycle inlet air cooling processes. The additional heat rejection capacity needed for providing inlet air cooling will comprise only a small proportion of the total so that the overall capacity of the low temperature heat rejection apparatus will not be greatly affected by this inclusion.

The system of the invention can deliver additional benefits to the topping cycle of fossil-fuelled combined cycle plants by providing energy-efficient combustion turbine intake air cooling. The accumulated night-cooled fluid can be used to reduce the daytime combustion inlet air temperature by an amount close to the diurnal temperature range. The amount of pre-cooling available from this source depends on the diurnal temperature variation. At sites suitable for deployment of the system of the invention, the amount of air cooling available is comparable to that provided by commercially available CTIAC (combustion turbine inlet air cooling) systems (about 20K). Reductions in the temperature of combustion inlet air are well known to increase both the output and the efficiency of the combustion turbine. The times of peak power demand often coincide with peak ambient temperatures in cooling dominated climates. Without some means of mitigating this ambient-linked reduction in output, the power plant may suffer significant performance losses at precisely those times when maximum power demands occur.

The system of the invention is able to offer a means of turbine inlet air cooling which requires no water consumption and which does not rely on energy intensive mechanical cooling. The coolant flow from the store is fed by the connection 107 into an air-cooling coil placed across the path of the turbine intake 103 In practice the provision of inlet air cooling as well as heat rejection temperature reduction can be accomplished with the system of the invention by a very minor increase (typically about 1%) in the size of the low temperature storage system. It is possible to augment the temperature reduction of the inlet air over and above that available directly from the diurnal temperature range by interposing a mechanical refrigeration unit in the pipework running between the low temperature store and the combustion inlet air cooling coil. This arrangement makes possible a greater degree of inlet air cooling while using only a fraction of the mechanical refrigeration power which otherwise would be required.

Non-Thermal Power Production Plants

The invention may be applied to non-thermal power production plants which have a substantial co-production of heat. One example is a concentrated solar photovoltaic (CPV) power plant (conversion of light to electricity). Power is produced in CPV plants through direct conversion of solar energy into electricity. Another example of this embodiment is a power plant using fuel cells to convert chemical stored energy into electricity.

It is known that only a fraction of the solar flux incident on the receiver can be converted to electricity via photovoltaic processes. The remaining portion of the incoming solar energy flux (generally more than half) is converted into heat. Disposal of this heat presents a challenge to the design of CPV plants since elevated temperatures of the solar receiver reduce the efficiency of the photovoltaic conversion and may cause degradation of the receiver itself over time.

Figure 5:
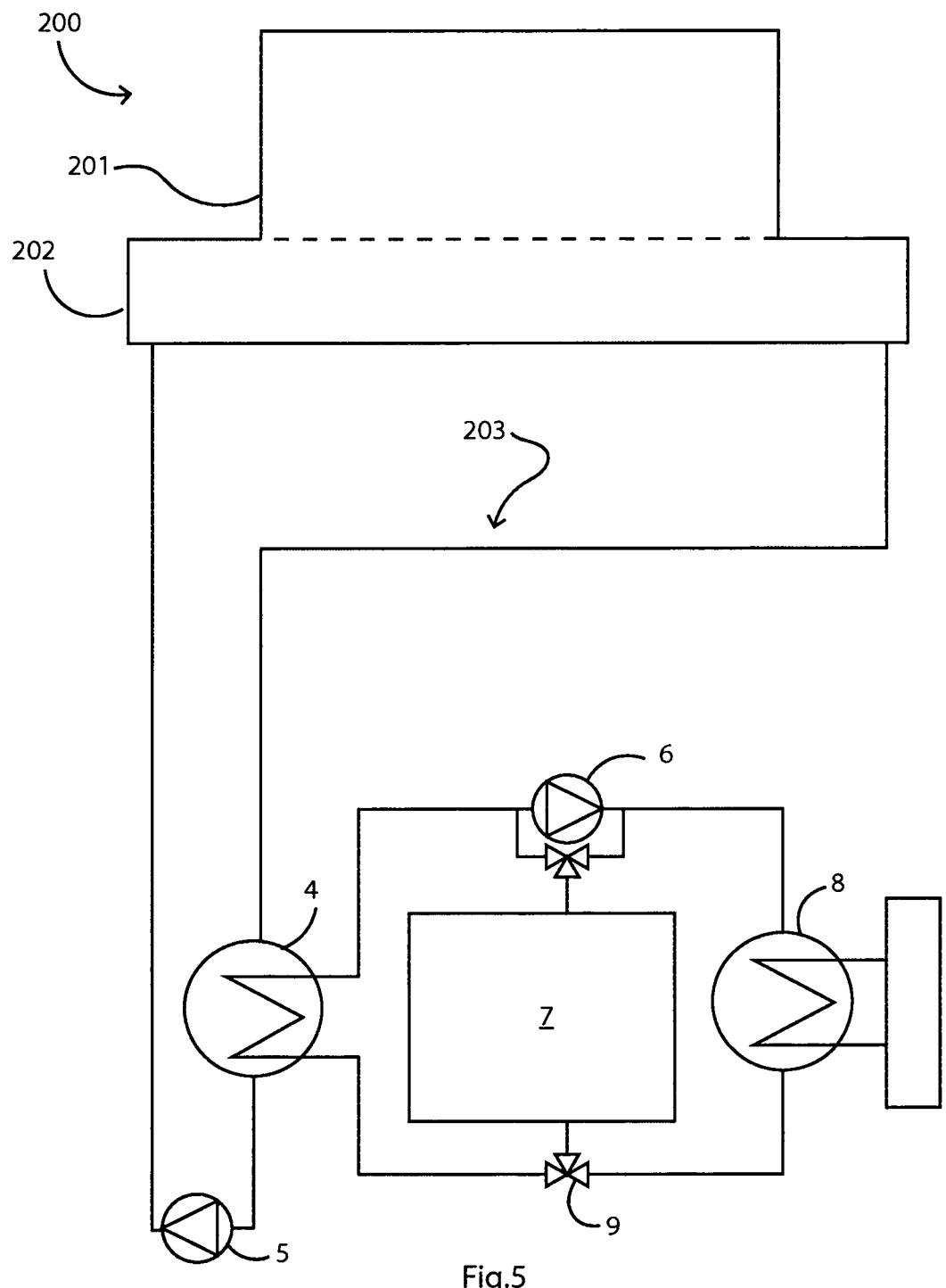

The invention if applied to the solar receiver heat sink permits the solar receiver to be operated at a lower temperature than would otherwise be possible and thereby to operate at higher efficiency and with reduced risk of thermal degradation. Reduction of the solar receiver operating temperature by the typically achievable figure of 20K is well known to those conversant in the art to provide measurable increases in photovoltaic conversion efficiency. An arrangement 200 is shown in FIG. 5. The principal difference between this embodiment and the first embodiment is that the power is produced by photovoltaic conversion of the solar flux and not by thermal conversion. A non-thermal energy conversion device 201 is directly in contact with a heat sink 202. Heat is removed from the heat sink 202 by a pumped "working fluid" loop 203 containing the circulating pump 5. The heat removed from the heat sink 202 is rejected into the lowest temperature of the diurnal cycle using the system of the invention in the same way as described with reference to FIG. 1.

By this method the non-thermal power generator is able to operate at a nearly constant temperature substantially lower than would be possible otherwise. This lower working temperature can provide both efficiency gains and extensions to component life expectancies.

Another way in which the system of the invention can be employed to good effect in CPV or other non-thermal power generation plants occurs in situations where it may be feasible to operate a thermal energy conversion process using the heat flux rejected from the photovoltaic receiver or other non-thermal energy conversion apparatus. CPV receivers are known to operate at temperatures in the range of 100° C. to 120° C. in current systems and may be capable of operation at higher temperatures as the technology is refined. Similar thermal conditions can occur in certain fuel cell power generating systems This situation presents the possibility of operating a thermal energy conversion system between the heat sink on the CPV receiver or the fuel cell and the ambient. A thermal energy conversion system operating between these temperatures could advantageously use either an ORC plant or a condensing supercritical $CO_2$ power production cycle as described above. An application of the system of the invention to a system of this type in a favourable climatic setting is capable of providing substantial power output gains to the aggregate plant. The aggregate power generation plant in this embodiment would have two power producing steps: primary power production coming from a non-thermal conversion process which produces waste heat at a usable temperature, and a secondary thermal conversion process which makes use of the waste heat to produce additional motive power and uses the system of the invention to maximise the performance of the thermal conversion step.

Figure 6:
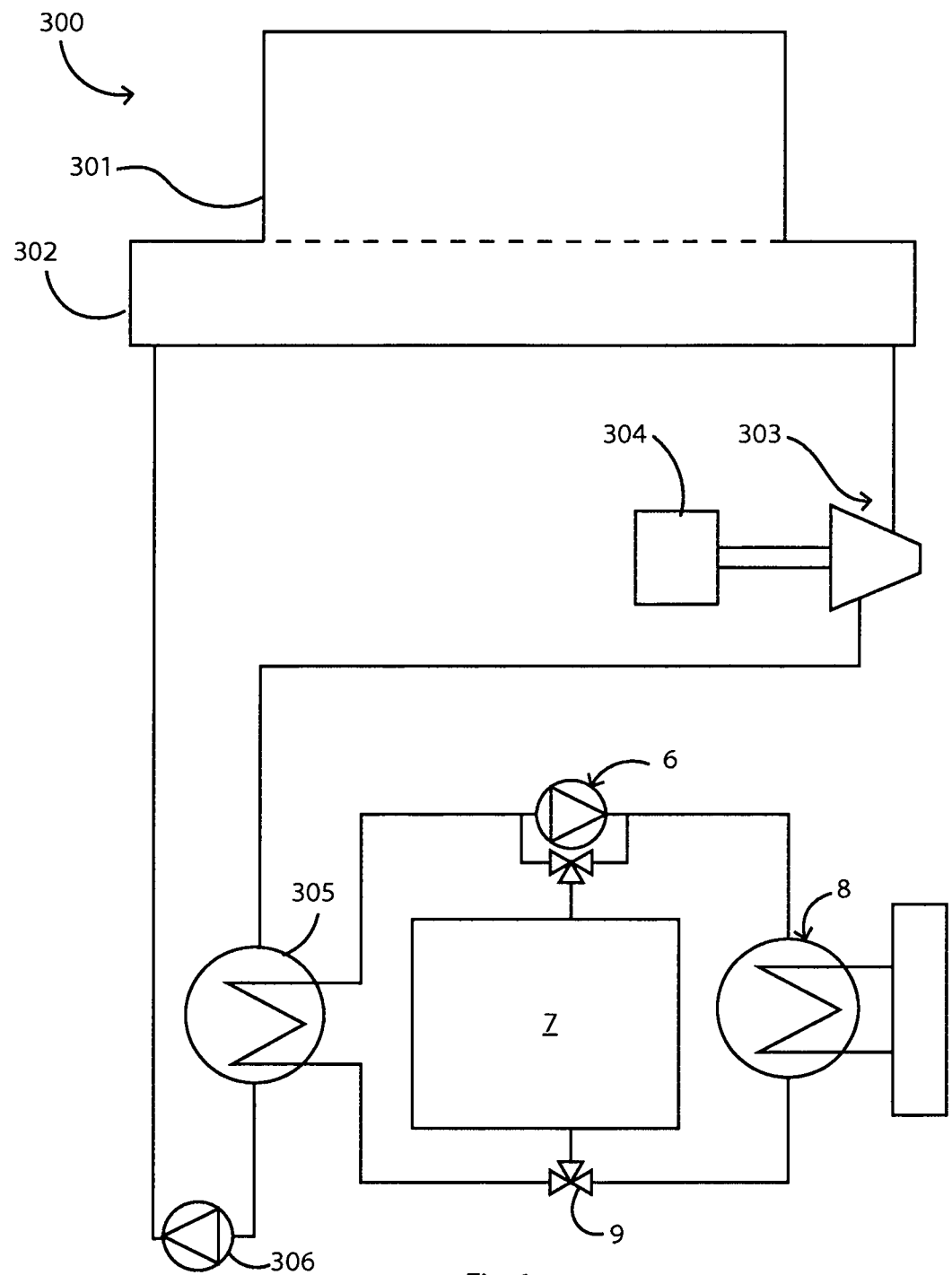

Another system, 300, is illustrated in FIG. 6. Here, a non-thermal energy conversion unit 301 is shown in contact with its heat sink 302. The heat sink in this case can provide a sufficient temperature rise of the heat sink cooling fluid ("working fluid") to drive an expansion engine 303, coupled to an electric generator 304. The working fluid is cooled and condensed in the heat exchanger 305, before being pressurised by the pump 306. The heat rejected from the thermal power cycle is stored for release during the coldest part of the night by the system of the invention, as described above for the other embodiments. Because the working temperatures of non-thermal power generators are limited to modest values, the influence of the system of the invention on the feasibility of secondary power production may be expected to be significant.

The invention is not limited to the embodiments described but may be varied in construction and detail. For example, the heat store may take the form of multiple interconnected tanks, and they may be at different levels. In this case, preferably the coolant is delivered into upper tank(s) and drawn from lower tank(s). The secondary heat exchanger may have a sequence of a number of back-to-back heat exchangers which terminate with at least partial ultimate heat rejection to ambient air.

The invention claimed is:

1. A power plant comprising an energy converter for converting heat energy to another form of energy with use of a working fluid, and a heat exchanger for rejecting heat from the working fluid, wherein the power plant comprises a secondary circuit for providing coolant to the heat exchanger, said secondary circuit comprising:

a store arranged to store coolant,
a secondary heat exchanger for rejecting heat to ambient air,
a coolant diverter
a controller configured to route coolant from the working fluid heat exchanger to:
(a) the store in order to reject heat to the store when the secondary heat exchanger is incapable of reducing coolant temperature below a threshold, or when temperature of coolant returning from the secondary heat exchanger exceeds a temperature at which coolant may be drawn from the store, or both,
(b) the secondary heat exchanger, and to
(d) choose (a) or (b) to provide more effective heat rejection from the coolant.

2. A power plant as claimed in claim 1, wherein the diverter is configured to route coolant to an upper portion of the store.

3. A power plant as claimed in claim 1, wherein the secondary circuit is configured to supply coolant to the working fluid heat exchanger from a lower portion of the store.

4. A power plant as claimed in claim 1, wherein the controller is configured to cause the secondary circuit to reject heat to the store during day-time and to reject heat by the secondary heat exchanger during night-time.

5. A power plant as claimed in claim 4, wherein the controller is configured to ensure that the secondary circuit coolant delivered from the store to the working fluid heat exchanger has been cooled to a temperature close to a minimum temperature of the previous night.

6. A power plant as claimed in claim 4, wherein the controller is configured to use the store only up to a time at which added heat can be rejected in a single 24-hour period.

7. A power plant as claimed in claim 1, wherein the secondary circuit comprises temperature sensors arranged to monitor ambient temperature, temperature of the working fluid at the stage of heat rejection, and a thermal profile of the store.

8. A power plant as claimed in claim 1 wherein said threshold is variable.

9. A power plant as claimed in claim 8, wherein the controller is configured to set the threshold value according to local meteorological data, a temperature profile of the store, and anticipated demand for heat rejection from the power generation plant.

10. A power plant as claimed in claim 1, wherein the controller:
(i) is configured to direct the coolant to the store when temperature of the coolant returning from the secondary heat exchanger exceeds a store working temperature, and wherein said store working temperature is the temperature at a coldest part of the store after a most recent regeneration; or
(ii) is configured to direct regeneration of the store by reducing temperature of coolant within the store; or
(iii) is configured to direct the coolant to the store according to (i) and is configured to direct regeneration of the store according to (ii).

11. A power plant as claimed in claim 10, wherein the controller is configured to direct simultaneous rejection of heat from power production into the working fluid and store regeneration, so that the store can be returned to a working temperature state during the coldest portion of the daily ambient temperature cycle.

12. A power plant as claimed in claim 10, wherein the controller is configured to direct regeneration for reducing temperature of the thermal store, in which commencement of regeneration begins when a calculated heat rejection capability of the secondary circuit heat exchanger approaches a quantity of heat which must be dumped by the end of the regeneration in order to fully regenerate the store.

13. A power plant as claimed in claim 10, wherein the controller is configured to dynamically set a target temperature profile for the store after regeneration.

14. A power plant as claimed in claim 1, wherein the controller is configured to vary flow rate of working fluid through the working fluid heat exchanger whenever a value for plant power output decreases below a set value or to reduce heat rejection temperature and cause an increase in power output.

15. A power plant as claimed in claim 1, wherein the thermal store includes baffles to reduce vertical flow of coolant within the store.

16. A power plant as claimed in claim 15 wherein there is at least one baffle near a top part of the store or wherein there are baffles at both an upper end of the store and a lower end of the store.

17. A power plant as claimed in claim 1, wherein the store comprises a tank arranged to be mounted underground.

18. A power plant as claimed in claim 1, wherein the controller is configured to simultaneously route coolant to both the store and to the secondary heat exchanger.

19. A power plant as claimed in claim 18, wherein the controller is configured to route coolant simultaneously to both the store and the secondary heat exchanger during a switchover phase in a gradual manner so that a portion of coolant flow is directed to the secondary heat exchanger is increased over time as ambient temperature drops.

20. A power plant as claimed in claim 1 wherein the power plant is a fossil fuel burning plant, and wherein the system includes a cooler for cooling combustion air using coolant drawn from the store.

21. A power plant as claimed in claim 1 wherein the power plant comprises photovoltaic cells for converting solar power to electrical energy, and the working fluid is in a circuit for cooling said photovoltaic cells.

22. A power plant as claimed in claim 21, wherein the power plant further comprises a thermodynamic conversion plant for converting energy from heated working fluid to electrical power.

23. In a method of controlling a power plant that includes:
a controller,
an energy converter for converting heat energy to another form of energy with use of a working fluid, and
a heat exchanger for rejecting heat from working fluid,
a secondary circuit for providing coolant to the heat exchanger, said secondary circuit comprising:
a store arranged to store coolant,
a secondary heat exchanger for rejecting heat to ambient air, and a coolant diverter,
the improvement comprising the steps of the controller routing coolant from the working fluid heat exchanger to the store in order to reject heat to the store, and/or to the secondary heat exchanger for providing effective heat rejection from the coolant, and
wherein the controller directs coolant to the store when temperature of coolant returning from the secondary heat exchanger exceeds a temperature at which coolant may be drawn from the store.

24. A method according to claim 23 in which
the controller and the diverter route coolant to an upper portion of the store, supply coolant to the working fluid heat exchanger from a lower portion of the store, and cause the secondary circuit to reject heat to the store during day-time and to reject heat by the secondary heat exchanger during night-time.

25. A method as claimed in claim 23, wherein the controller directs regeneration of the store by reducing temperature of coolant within the store.

26. A method as claimed in claim 25, wherein the controller directs simultaneous rejection of heat from the working fluid and store regeneration, so that the store can be returned to a working temperature state during the coldest portion of the daily ambient temperature cycle.

27. A method as claimed in claim 23, wherein the controller routes coolant simultaneously to both the store and the secondary heat exchanger during a switchover phase in a gradual manner so that a portion of coolant flow is directed to the secondary heat exchanger is increased over time as ambient temperature drops.

* * * * *